(12) United States Patent
Cerniglia et al.

(10) Patent No.: US 7,064,264 B2
(45) Date of Patent: Jun. 20, 2006

(54) KEYED FILLER PANEL WITH INTEGRATED RECESSED REGION FOR ATTACHING DEVICE

(75) Inventors: Sean A. Cerniglia, Cool, CA (US); Michael J. Greenside, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 418 days.

(21) Appl. No.: 10/082,435

(22) Filed: Feb. 22, 2002

(65) Prior Publication Data

US 2003/0151872 A1 Aug. 14, 2003

Related U.S. Application Data

(63) Continuation-in-part of application No. 10/077,724, filed on Feb. 14, 2002, now Pat. No. 6,967,279.

(51) Int. Cl.
*H05K 9/00* (2006.01)

(52) U.S. Cl. .............................. 174/35 R; 174/35 GC; 174/135

(58) Field of Classification Search ............. 174/35 R, 174/35 GC, 135; 439/135, 345; 361/683, 361/686, 726, 727, 725, 724
See application file for complete search history.

(56) References Cited

U.S. PATENT DOCUMENTS 6,098,133 A * 8/2000 Summers et al. ........... 710/107
6,285,548 B1 * 9/2001 Hamlet et al. .............. 361/695

* cited by examiner

*Primary Examiner*—Jinhee Lee

(57) ABSTRACT

A keyed filler panel with integrated recessed region for attaching device is disclosed. In one embodiment, the present invention includes a filler panel body. The present embodiment also includes a recessed portion integral with the filler panel body. The recessed portion is fixedly coupled with the filler panel body, and adapted to receive an attaching device for removably coupling the filler panel body with respect to a chassis.

13 Claims, 17 Drawing Sheets

FIG 9A-D

SIDE VIEW 1500

FRONT VIEW 1530

SIDE VIEW 1600

FRONT VIEW 1625

KEYED FILLER PANEL WITH INTEGRATED RECESSED REGION FOR ATTACHING DEVICE

RELATED UNITED STATES APPLICATION

This application is a Continuation-in-Part of co-pending U.S. patent application Ser. No. 10/077,724, entitled "Filler Panel With Integrated Handle," with filing date Feb. 14, 2002 now U.S. Pat. No. 6,967,279, by Sean A. Cerniglia and Michael J. Greenside, and assigned to the assignee of the present application.

TECHNICAL FIELD

The present claimed invention relates to the field of chassis structures. More specifically, the present claimed invention relates to filler panels employed in conjunction with chassis structures.

BACKGROUND ART

Filler panels are conventionally used in conjunction with various computer chassis for electromagnetic interference (EMI) containment as well as for sealing of the computer chassis/card cage for thermal (e.g. forced airflow) cooling purposes. Specifically, in a conventional computer chassis/card cage assembly, multiple slots are available to receive a corresponding printed circuit assembly (PCA). The filler panels are attached to the computer chassis to enclose or seal off regions/slots of the computer chassis which do not have a printed circuit assembly (PCA) disposed therein. Typically, conventional filler panels are attached to the computer chassis using captive screws. The captive screws are disposed on the filler panels at locations corresponding to mounting holes residing within the computer chassis.

The location and the spacing of mounting holes within the computer chassis (and the corresponding location of the captive screws on the filler panels) are often defined by an industry standard. Typical standards include, for example, the compact peripheral component interconnect (CPCI) standard, and the VersaModular Eurocard (VME) standard. For example, the CPCI standard dictates that the gap between adjacent units (e.g. adjacent filler panels, adjacent PCAs, or a PCA and an adjacent filler panel) be nominally set at 0.30 millimeters. Unfortunately, industry standard captive screws allow the filler panel to be mispositioned by more than 1.0 millimeter. For purposes of the present application, this mispositioning with respect to the computer chassis, caused in some cases by the use of captive screws, is referred to as interference generating movement. During use, the interference generating movement of the filler panels can deleteriously prevent insertion of a PCA or a filler panel. That is, interference generating movement of one or more filler panels can result in insufficient space in a neighboring slot such that a filler panel or a PCA will not fit in the compromised gap.

With reference now to Prior Art FIG. 1, an example of a compromised gap produced as a result of interference generating movement of a filler panel is clearly illustrated. As shown in Prior Art FIG. 1, a portion of a computer chassis 100 is depicted having mounting holes, typically shown as 102, therein. A filler panel 104 is shown coupled to computer chassis 100 and, for purposes of illustration, filler panel 104 is depicted as being coupled to computer chassis 100 without any substantial interference generating movement. Another filler panel 106 is also shown coupled to computer chassis 100. In this example, filler panel 106 is depicted as being coupled to computer chassis 100 with substantial interference generating movement due to the use of captive screws 107a and 107b. Specifically, filler panel 106 is depicted as having been mispositioned in a direction towards neighboring gap 108 and filler panel 104. Dotted line 110 illustrates the desired or nominal location of filler panel 106 assuming no interference generating movement. Because of the interference generating movement of filler panel 106, the width, w, of gap 108 is less than the width of a filler panel or a PCA. Hence, it is no longer possible to readily place a filler panel or a PCA into gap 108. Additionally, the width of gap 108 may be even further compromised (i.e. reduced) in the case where filler panel 104 suffers from interference generating movement which mispositions filler panel 104 in a direction towards neighboring gap 108 and filler panel 106.

At present, one approach to fix the problem described above, is to first have all of the necessary filler panels loosely connected to the computer chassis. Once all of the filler panels are in place, the filler panels are then carefully tightened to the computer chassis in order to insure that interference generating movement is reduced as much as possible. However, such a method is time-consuming, cumbersome, and lacks the desired "Design for Manufacturability (DFM)."

The problem described in conjunction with Prior Art FIG. 1 is particularly egregious in light of the increased prevalence of "hot swapping." Hot swapping refers to a process in which a PCA is added to or removed from the computer chassis without powering down the system. With hot swapping, it is imperative that interference generating movement is reduced in order to facilitate rapid and perhaps frequent removal and addition of PCAs and filler panels.

One prior art attempt to resolve the problem of interference generating movement involves customizing a computer chassis with a non-standard sheet metal interface having predefined openings formed therein. Specially designed filler panels are also employed in conjunction with the non-standard customized computer chassis. Such an approach has severe drawbacks associated therewith. For example, a non-standard customized chassis allows DFM tolerancing that makes is very difficult to hold CPCI standard specifications. Furthermore, limiting customers to the use of one particular design/maker of filler panels is not favorable.

A further drawback of prior art filler panels is the mounting method for captive screws used in conjunction with filler panel assemblies. Specifically, as stated above, a filler panel mounted to a chassis is a tight fit. In fact, if captive screws are not utilized, ensuring a proper fit between the chassis and the filler panel is extremely difficult. In addition, since a filler panel is required for each slot not occupied with any type of complete assembly (i.e. any empty slot), on any given chassis, the number of empty slots can be extensive. As such, the multiplicity of required filler panels translates into a multiplicity of captive screw mounts. For example, FIG. 3 illustrates a keyed filler panel assembly 300 in which the attaching device is comprised of a captive screw 204 and an underlying D-clip 302.

It is appreciated that each underlying D-clip 302 has an associated per item cost. It is further appreciated that a second cost is accrued with regard to assembly. Specifically, for every part required in the assembly operation, time and labor factors must be accounted for in the assembly process. That is, time and labor requirements translate into accrued costs. As a result, the associated costs of a filler panel assembly can deleteriously effect company profit.

A further problem has arisen with regard to the removal of filler panel assemblies. Specifically, as stated above, a filler panel mounted to a chassis is a tight fit. In fact, the EMI gasket causes a friction force which helps hold a filler panel in-place. Further, as shown in Prior Art FIG. 1, the face of the filler panel is smooth with nothing to grasp. Thus, with a multiplicity of filler panels or complete assemblies mounted on a chassis, removal of a single filler panel is both difficult and time consuming.

DISCLOSURE OF THE INVENTION

The present invention provides a method and apparatus for a filler panel with integrated recessed region for attaching device which decreases alignment issues of a filler panel with respect to the chassis. The present invention also provides a method and apparatus for a filler panel with integrated recessed region for attaching device which reduces manufacturing and assembly costs. The present invention also provides a method and apparatus for a filler panel with integrated recessed region for attaching device which achieves the above accomplishment and which facilitates hot swapping of PCA cards. The present invention also provides a method and apparatus for a filler panel with integrated recessed region for attaching device which achieves the above accomplishments and which can be adapted to readily interface with industry standard components and meet industry standard specifications.

Specifically, a keyed filler panel with integrated recessed region for attaching device is disclosed. In one embodiment, the present invention is comprised of a filler panel body. The present embodiment is further comprised of a recessed portion integral with the filler panel body. The recessed portion is fixedly coupled with the filler panel body, and adapted to receive an attaching device for removably coupling the filler panel body with respect to a chassis.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. In other instances, well-known methods, procedures, components, and circuits have not been described in detail as not to unnecessarily obscure aspects of the present invention.

Locating Element Physical Characteristics

Figure 1:
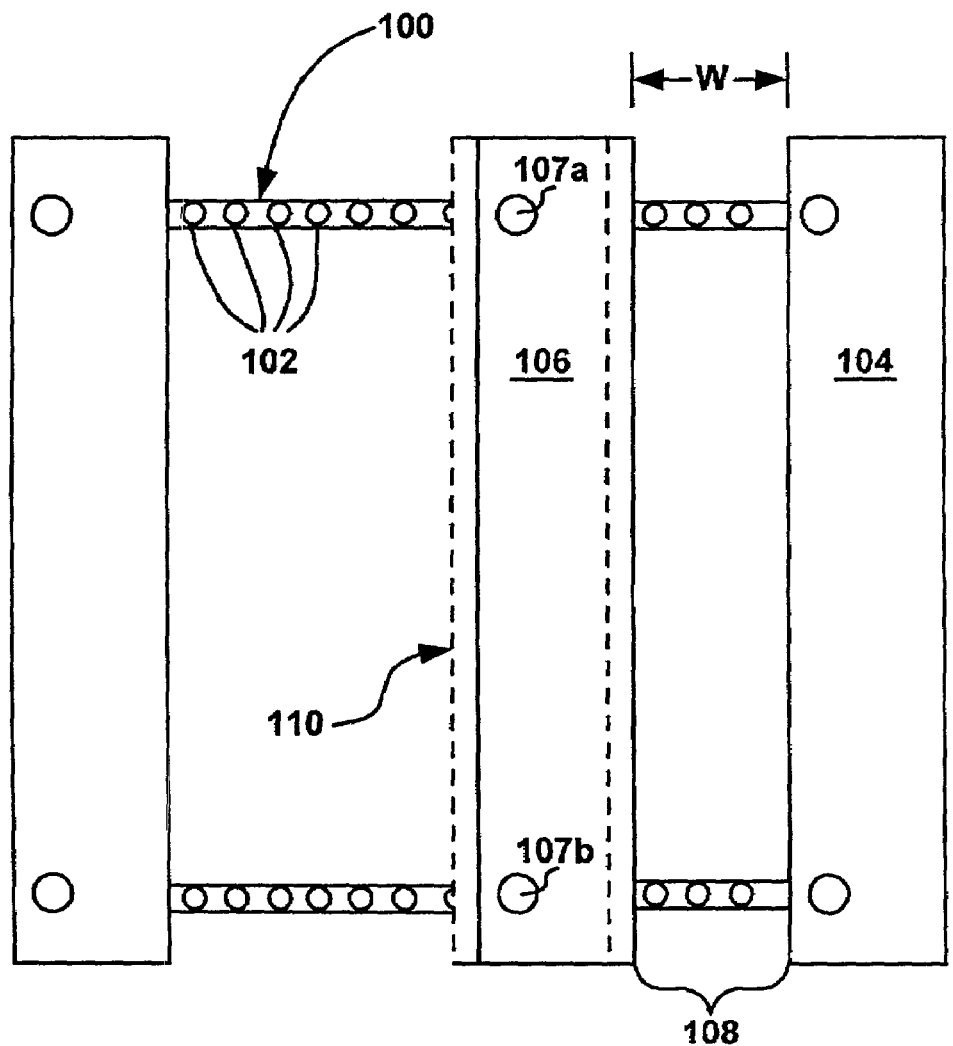
FIG. 1 is a front view of a plurality of conventional filler panels coupled to a computer chassis wherein interference generating movement has compromised the gap between to filler panels.
Figure 2:
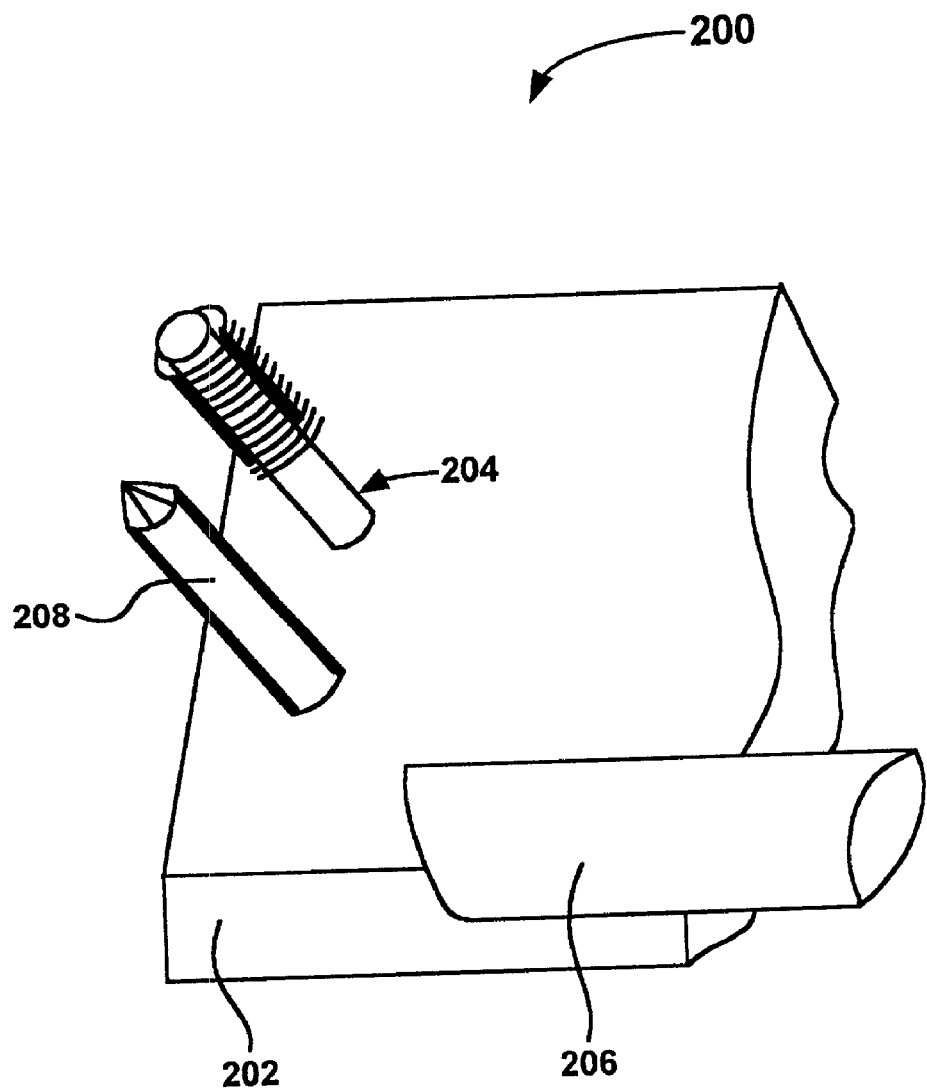
FIG. 2 is a perspective view of a keyed filler panel assembly in accordance with one embodiment of the present claimed invention.

With reference now to FIG. 2, a perspective view of a keyed filler panel assembly 200 in accordance with one embodiment of the present claimed invention is shown. The following discussion will begin with a detailed description of the physical characteristics of the present keyed filler panel assembly. The discussion will then contain a detailed description of the use and operation of the present keyed filler panel assembly. Regarding the physical structure of the present keyed filler panel assembly, for purposes of clarity, only one end of the keyed filler panel assembly 200 is shown in FIG. 2. In the present embodiment keyed filler panel assembly 200 includes a filler panel body 202. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIG. 2, keyed filler panel assembly 200 also includes an attaching device 204 which is adapted to be coupled to filler panel body 202. In one embodiment, attaching device 204 is comprised of a captive screw. Attaching device 204 is ultimately employed for removably coupling filler panel body 202 to a computer chassis. Importantly, as will be discussed in detail below, in one embodiment, attaching device 204 is an attaching device formed having dimensions and characteristics which are in compliance with an industry standard such as, for example, the CPCI standard, and the VME standard. For purposes of brevity and clarity each of the numerous possibilities of attaching devices 204 are not shown in the present Figures.

With reference again to FIG. 2, keyed filler panel assembly 200 of the present embodiment also includes an electromagnetic interference (EMI) shield portion 206 coupled to filler panel body 202. EMI shield portion 206 is employed to prevent EMI leakage from a chassis to which keyed filler panel assembly 200 is ultimately coupled. In one embodiment, EMI shield portion 206 is removably coupleable to filler panel body 202. The present embodiment is also well suited to an embodiment in which EMI shield portion 206 is integral with filler panel body 202.

Figure 4:
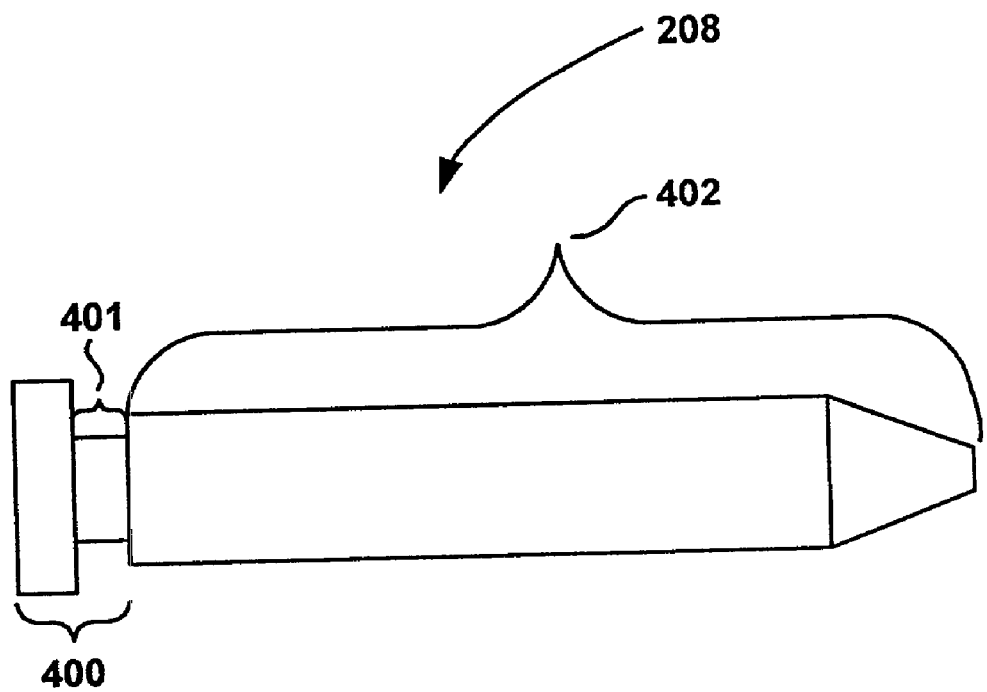
FIG. 4 is a side view of a locating element in accordance with one embodiment of the present claimed invention.
Figure 5:
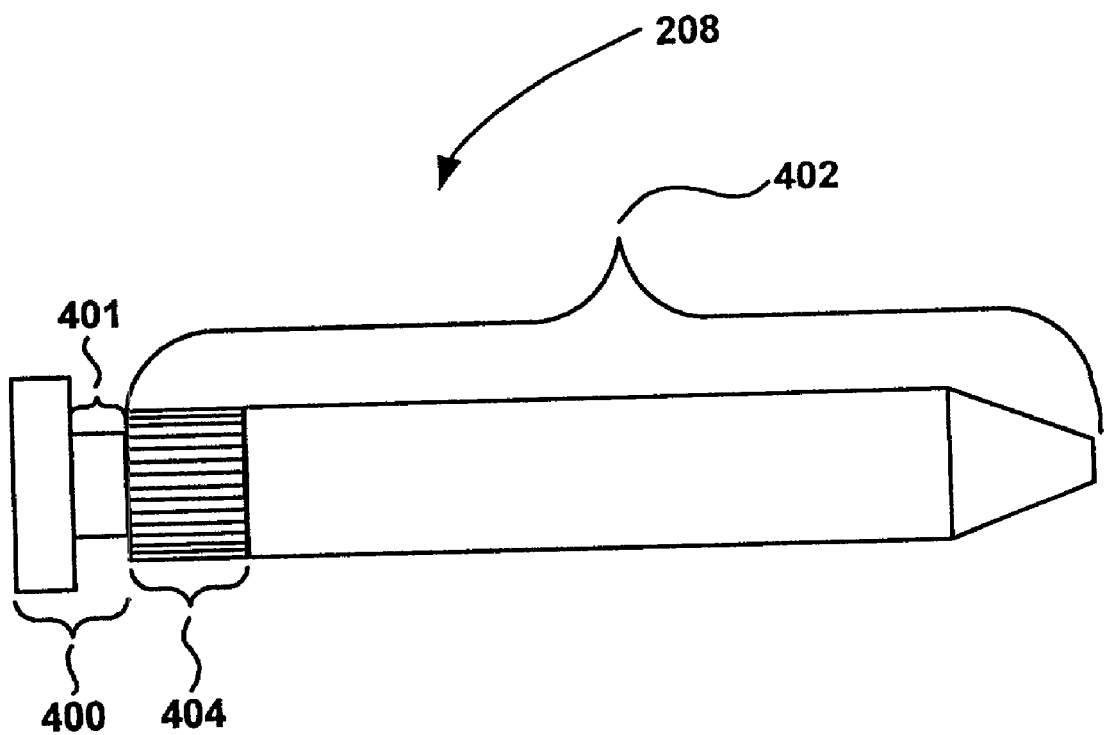
FIG. 5 is a side view of a locating element including a retaining portion in accordance with another embodiment of the present claimed invention.

Keyed filler panel assembly 200 of the present invention also includes a locating element 208 which is coupled to filler panel body 202. FIG. 4 shows a side view of one embodiment of locating element 208. As shown in FIG. 4, in one embodiment, locating element 208 is comprised of a head portion 400, and an insertion portion 402. As will be discussed below in detail, in one embodiment, head portion 400 is adapted to be arranged flush with filler panel body 202 of FIGS. 2 and 3. Insertion portion 402 of locating element 208 is adapted to be inserted in an opening (e.g. a mounting hole) in a computer chassis to reduce interference generating movement of filler panel body 202 of FIGS. 2 and 3 with respect to the computer chassis. FIG. 5 illustrates another embodiment of the present invention in which locating element 208 also includes a retention portion 404 which is coupled to head portion 400. Retention portion 404 is adapted to enhance coupling of locating element 208 and filler panel body 202 of FIGS. 2 and 3. As will be described in detail below, locating element 208 is adapted to orient filler panel body 202 with respect to a computer chassis such that interference generating movement of filler panel body 202 is reduced.

Locating Element Use and Operation

The following is a detailed description of the use and operation of the present keyed filler panel assembly. With reference again to FIGS. 2 and 3, in one embodiment of the present invention, locating element 208 is coupled to a filler panel body such as filler panel body 202. In one embodiment, locating element 208 is inserted through filler panel body 202 proximate to the location where attaching device 204 is or will be disposed. In the present embodiment, locating element 208 rigidly extends from filler panel body 202 and does not shift in position with respect to filler panel body 202.

Figure 6:
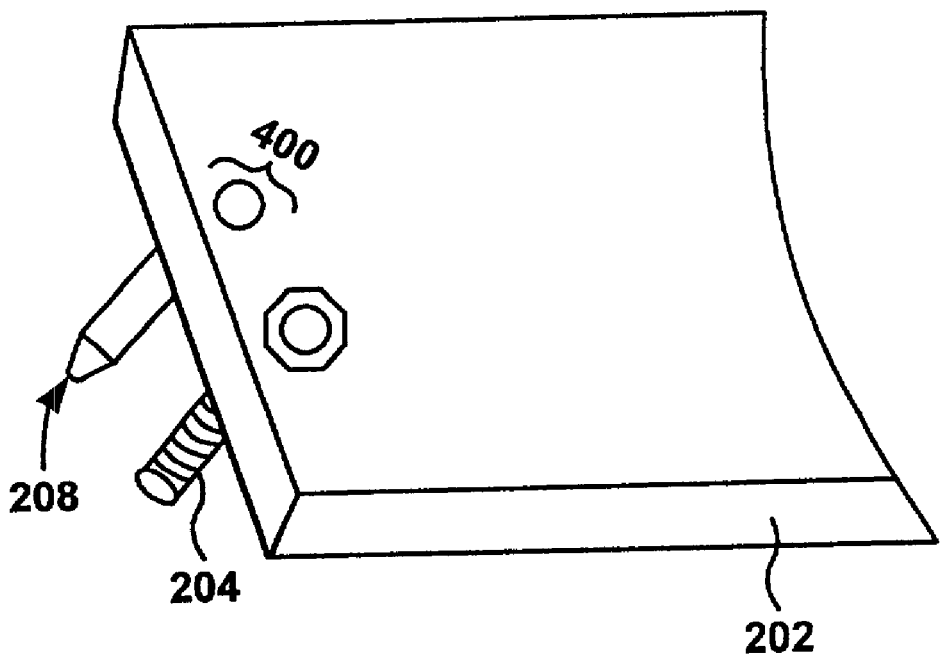
FIG. 6 is a perspective view of a keyed filler panel assembly in which the top surface of the head portion of a locating element is flush with the receiving surface of a filler panel body in accordance with one embodiment of the present claimed invention.

In one embodiment of the present invention, the locating element 208 is coupled to filler panel body 202 such that the top surface of head portion 400 is flush with the receiving surface of filler panel body 202. FIG. 6 illustrates an embodiment in which the top surface of head portion 400 is flush with the receiving surface of filler panel body 202. In one embodiment, the shape of head portion 400, including recessed region 401, assists in the coupling of locating element 208 to a filler panel body. Also, as shown in FIG. 5, in one embodiment of the present invention, retention portion 404 is comprised, for example, of ridges which assist in the rigid attachment of locating element 208 to filler panel body 202 by "gripping" the surrounding material comprising filler panel body 202.

With reference again to FIGS. 2 and 3, in one embodiment of the present invention, locating element 208 is coupled to filler panel body 202 at a location such that insertion portion 402 of FIGS. 4 and 5 of locating element 208 will correspond to mounting holes disposed on a computer chassis. That is, in one such embodiment, locating element 208 is rigidly coupled to filler panel body 202 at a location such that insertion portion 402 will subsequently engage an opening in a computer chassis and, in so doing, firmly retain filler panel body 202 at a desired orientation with respect to the computer chassis. As a result, subsequent to the insertion of locating element 208 into an opening in computer chassis, the present invention allows attaching device 204 to be coupled to the computer chassis without concern for deleterious interference generating movement.

Furthermore, in one embodiment of the present invention, locating element 208 is coupled to filler panel body 202 at a location which corresponds to an industry standard such as, for example, the compact peripheral component interconnect (CPCI) standard or the VersaModular Eurocard (VME) standard. In such an embodiment, locating element 208 is rigidly coupled to filler panel body 202 at a location such that insertion portion 402 will subsequently engage an opening (e.g. a mounting hole) in a computer chassis and, in so doing, firmly retain filler panel body 202 at an orientation such that the nominal spacing specified by the standard between an adjacent device (e.g. another filler panel or a PCA) is obtained.

Figure 7:
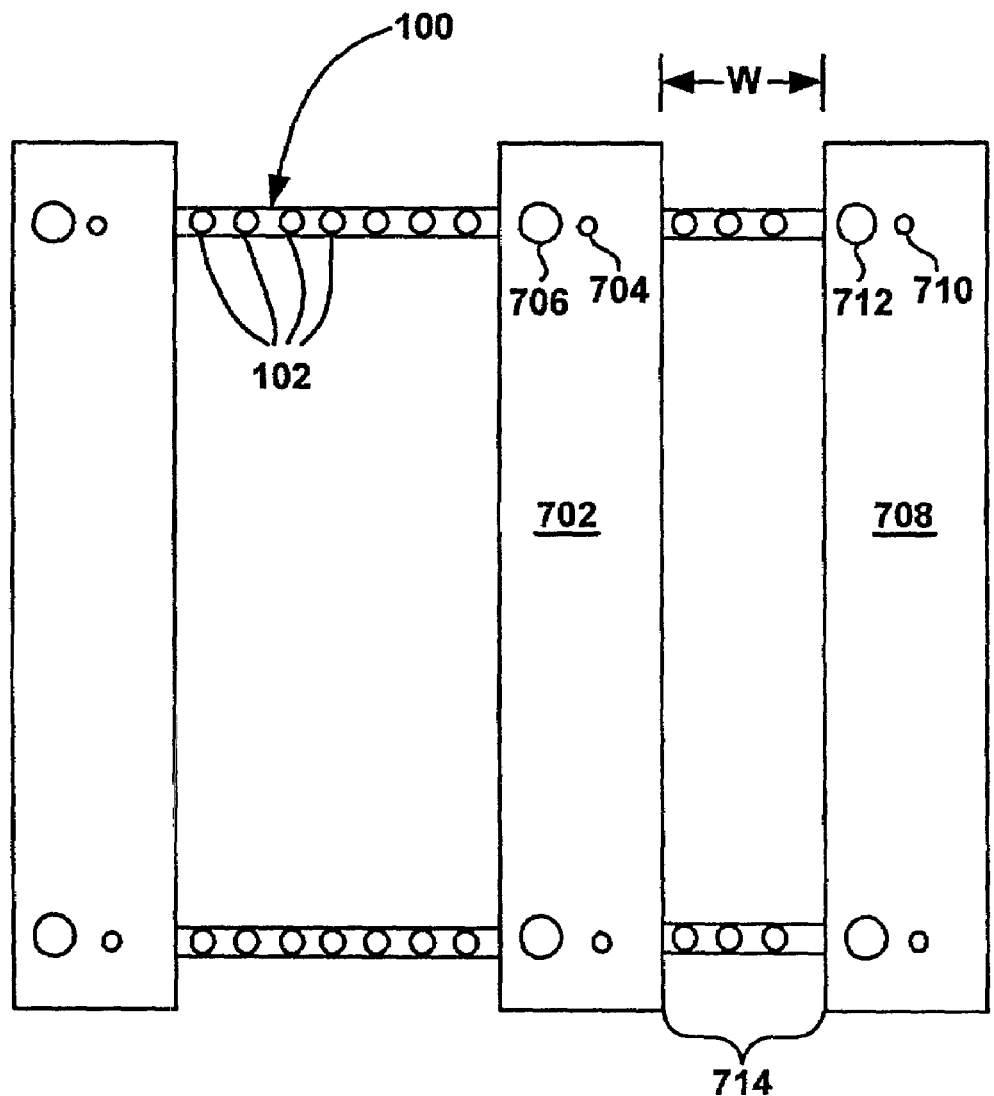
FIG. 7 is a front view of a plurality of keyed filler panel assemblies coupled to a computer chassis wherein interference generating movement has reduced in accordance with one embodiment of the present claimed invention.

With reference now to FIG. 7, an example of an embodiment in which the present invention obtains the nominal spacing specified by a standard between adjacent units is illustrated. As shown in FIG. 7, a portion of a computer chassis 100 is depicted having mounting holes, typically shown as 102, therein. For purposes of the present example, the spacing between mounting holes 102 is defined by the CPCI standard. A keyed filler panel assembly 702 is shown coupled to computer chassis 100 using locating element 704 and an attaching device 706 in accordance with one embodiment of the present invention. As a result, keyed filler panel assembly 702 is coupled to computer chassis 100 without any substantial interference generating movement. Another keyed filler panel assembly 708 is also shown coupled to computer chassis 100. In this example, keyed filler panel assembly 708 is also coupled to computer chassis 100 using a locating element 710 and an attaching device 712 in accordance with one embodiment of the present invention. As a result, keyed filler panel assembly 708 is also coupled to computer chassis 100 without any substantial interference generating movement. Because the present embodiment reduces interference generating movement of keyed filler panel assemblies 702 and 708, the width, W, of gap 714 is maintained at the nominal width allotted by the standard to accommodate the insertion of another filler panel or a PCA. Hence, the present embodiment eliminates the unwanted interference found in the prior art.

Figure 8:
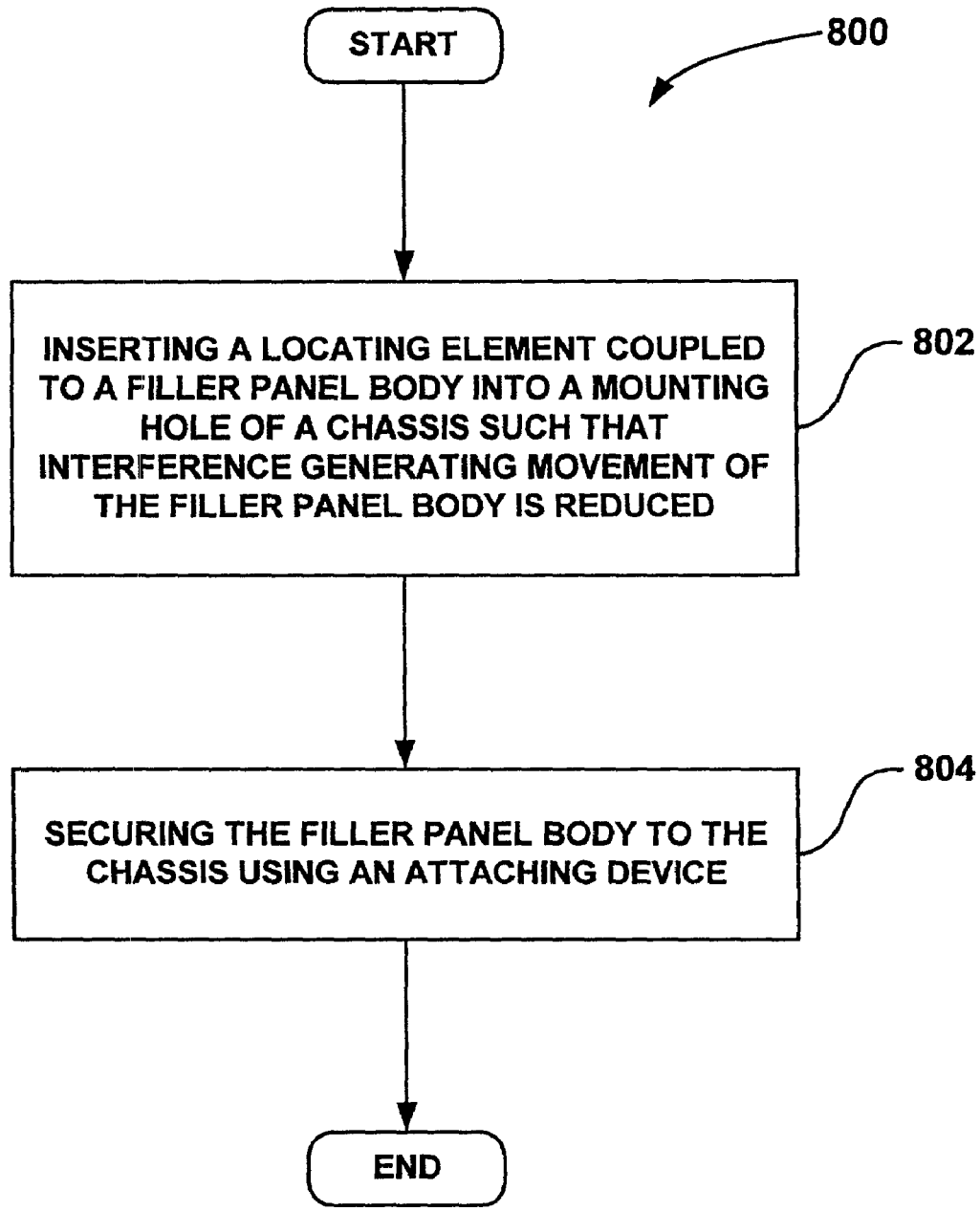
FIG. 8 is a flow chart of steps performed in accordance with one embodiment of the present claimed invention.

With reference now to FIG. 8, a flow chart 800 summarizing the steps performed in accordance with one embodiment of the present invention is shown. At step 802, the present embodiment inserts a locating element, coupled to a filler panel body, into a mounting hole of a chassis. As described in detail above, the locating element (e.g. locating element 208 of FIGS. 2 and 3) is adapted to orient a filler panel body with respect to the computer chassis such that interference generating movement of the filler panel body is reduced.

Figure 3:
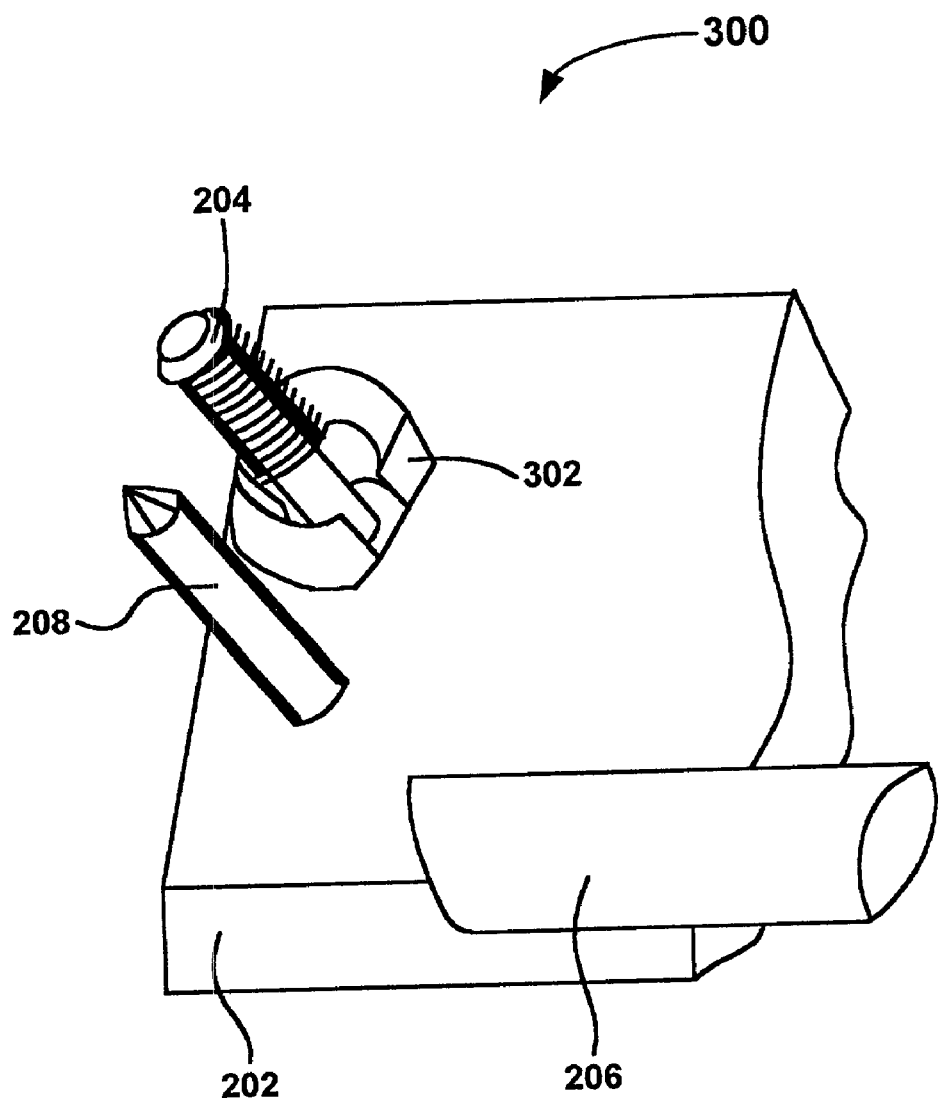
FIG. 3 is a perspective view of another embodiment of a keyed filler panel assembly in which the attaching device is comprised of a captive screw and an underlying D-clip in accordance with one embodiment of the present claimed invention.

Next, at step 804, the present embodiment then secures the filler panel body of the keyed filler panel assembly to the chassis using an attaching device (e.g. captive screw 204 of FIGS. 2 and 3). Beneficially, the present embodiment eliminates the need to first have all of the necessary filler panels loosely connected to the computer chassis and then subsequently tighten the arranged filler panels. Instead, the present embodiment allows keyed filler panel assemblies to be independently coupled to a computer chassis at any time without concern for the subsequent attachment of additional filler panels or PCAs. Thus, the present invention achieves a "Design for Manufacturability" lacking in the prior art. Additionally, by reducing interference generating movement and enabling the independent attachment of keyed filler panel assemblies to a computer chassis, the present invention is extremely well suited to use in hot swapping environments.

Integrated Handle Physical Characteristics

With reference now to FIGS. 9A–D, perspective views of keyed filler panel assemblies with integrated handles in accordance with embodiments of the present claimed invention are shown. The following discussion will begin with a detailed description of the physical characteristics of the present keyed filler panel assembly with integrated handle. The discussion will then contain a detailed description of the use and operation of the present keyed filler panel assembly with integrated handle. In the present embodiments, keyed filler panel assemblies 900, 925, 950, and 975 include integrated handles 902, 904, 906, 908, 910, and 912. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIGS. 9A–D, keyed filler panel assemblies 900, 925, 950, and 975 also include and attaching device 204 which is adapted to be coupled to filler panel body 202. In one embodiment, attaching device 204 is comprised of a captive screw. Attaching device 204 is ultimately employed to removably couple filler panel body 202 to a computer chassis. Importantly, as will be discussed in detail below, in one embodiment, attaching device 204 is an attaching device formed having dimensions and characteristics which are in compliance with an industry standard such as, for example, the CPCI standard, and the VME standard. For purposes of brevity and clarity each of the numerous possibilities of attaching devices are not shown in the present Figures.

With reference again to FIGS. 9A–D, keyed filler panel assemblies 900, 925, 950, and 975 of the present embodiment also includes an electromagnetic interference (EMI) shield portion 206 coupled to filler panel body 202. EMI shield portion 206 is employed to prevent EMI leakage from a chassis to which keyed filler panel assemblies 900, 925, 950, and 975 are ultimately coupled. In one embodiment, EMI shield portion 206 is removably coupleable to filler panel body 202. The present embodiment is also well suited to an embodiment in which EMI shield portion 206 is integral with filler panel body 202.

Figure 10:
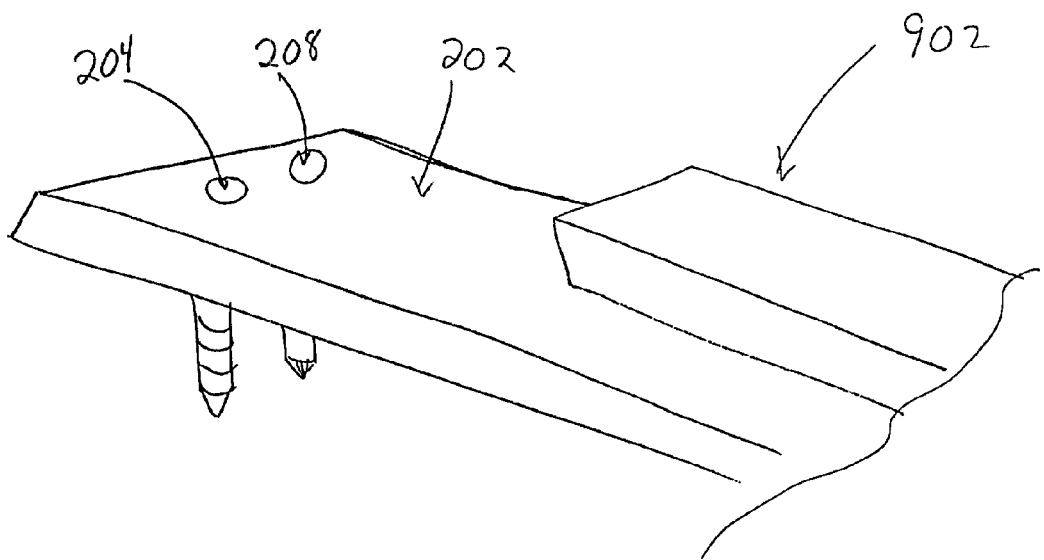
FIG. 10 is a perspective view of a keyed filler panel assembly with integrated handle in which the filler panel further comprises a locating element in accordance with one embodiment of the present claimed invention.

Keyed filler panel assembly 1000 of FIG. 10 also includes a locating element 208 which is coupled to filler panel body 202. FIG. 4 shows a side view of one embodiment of locating element 208. As shown in FIG. 4, in one embodiment, locating element 208 is comprised of a head portion 400, and an insertion portion 402. As discussed in detail above, in one embodiment, head portion 400 is adapted to be arranged flush with filler panel body 202 of FIG. 10. Insertion portion 402 of locating element 208 is adapted to be inserted in an opening (e.g. a mounting hole) in a computer chassis to reduce interference generating movement of filler panel body 202 of FIG. 10 with respect to the computer chassis. FIG. 5 illustrates another embodiment in which locating element 208 also includes a retention portion 404 which is coupled to head portion 400. Retention portion 404 is adapted to enhance coupling of locating element 208 and filler panel body 202 of FIG. 10. As described in detail above, locating element 208 is adapted to orient filler panel body 202 with respect to a computer chassis such that interference generating movement of filler panel body 202 is reduced.

Integrated Handle Use and Operation

Figure 9:
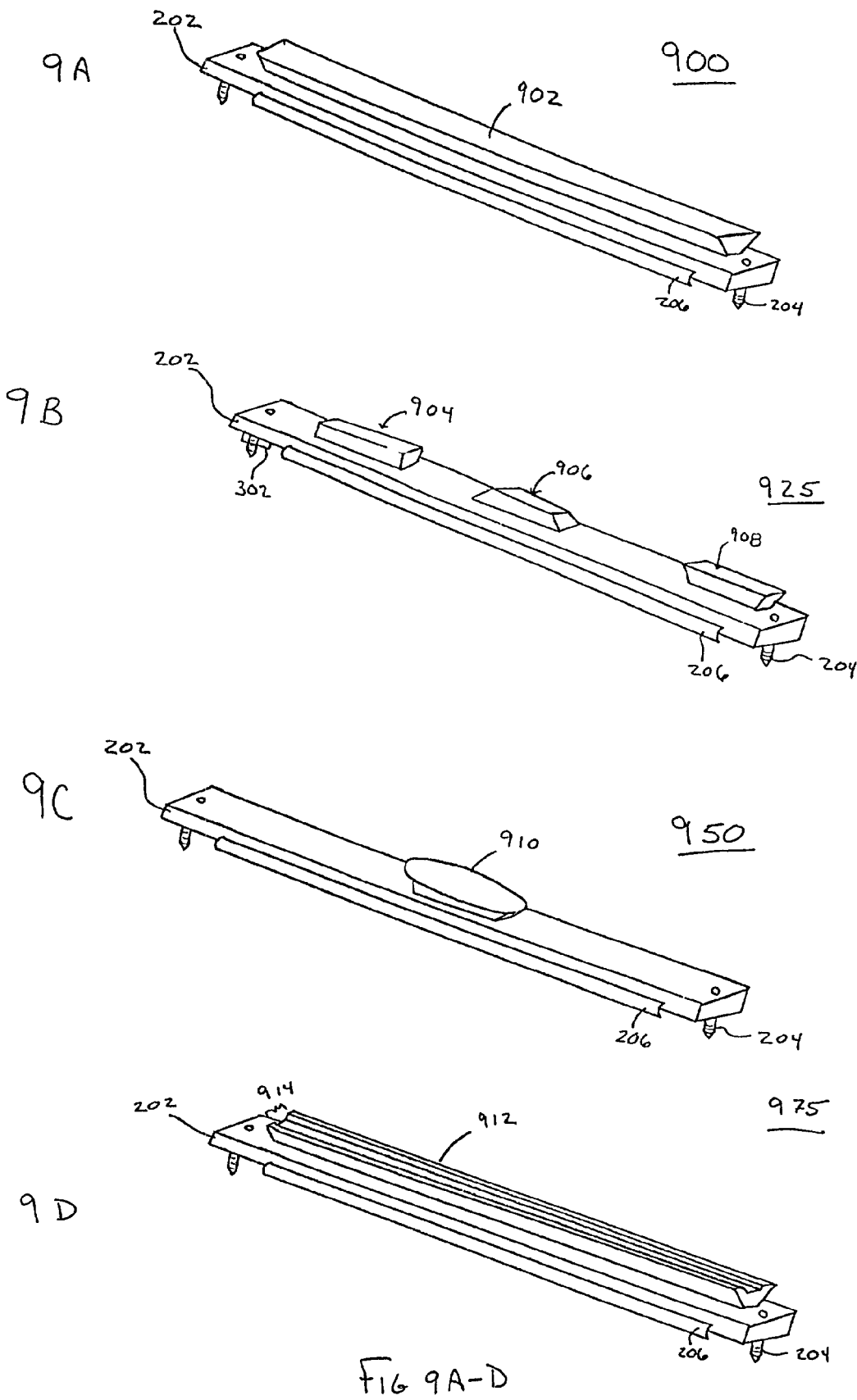
FIG. 9A is a perspective view of a keyed filler panel assembly with integrated handle in accordance with one embodiment of the present claimed invention.
FIG. 9B is a perspective view of another embodiment of a keyed filler panel assembly with integrated handle in which the attaching device is comprised of a captive screw and an underlying D-clip in accordance with one embodiment of the present claimed invention.
FIG. 9C is a perspective view of a keyed filler panel assembly with integrated handle in accordance with another embodiment of the present claimed invention.
FIG. 9D is a perspective view of another embodiment of a keyed filler panel assembly with integrated handle in which the integrated handle further comprises a recess in accordance with one embodiment of the present claimed invention.

The following is a detailed description of the use and operation of the present keyed filler panel assembly with integrated handle. With reference to FIGS. 9A, a handle element 902 is integral with filler panel body 202. In general, the filler panel body with integrated handle element is formed utilizing processes such as "extruding", "shaping", "casting", "molding", "machining", "milling", "welding", "sculpting", "compressing" or the like. Thus, in one embodiment, handle element 902 is fixedly coupled with filler panel body 202. Moreover, handle element 902 does not destructively interfere with attaching device 204 coupled with filler panel body 202. Generally speaking, handle element 902 is adapted to provide a grasping surface above filler panel body 202 such that removably coupling filler panel body 202 with respect to computer chassis 100 is simplified. Specifically, handle element 902 offers a protrusion which allows a user to obtain positive control of the keyed filler panel assembly 900. That is, by utilizing handle element 902, a user is able to easily decouple keyed filler panel assembly 900 from a computer chassis 100. Additionally, FIGS. 9A–C illustrate a multitude of possible integrated handle shapes (i.e. 902, 904, 906, 908, and 910) which may be utilized with keyed filler panel 202. Although, a specific variety of possible integrated handle shapes are shown, the illustrations are meant to be instructive not inclusive. Thus, it is appreciated that the present embodiment may incorporate multiple variations of integrated handle shapes within the scope of the present invention.

As is further illustrated in FIGS. 9B, the present embodiment is capable of maintaining more than one integrated handle (e.g. 904, 906, and 908) upon a specific filler panel 202. Moreover, as illustrated in FIG. 9B, the integrated handles (e.g. 904, 906, and 908) may be different shapes and sizes. Similarly, as illustrated in FIG. 9C, a further embodiment may include only a single integrated handle 910 which is comparatively smaller in size than the filler panel 202 on which it is fixedly coupled. Furthermore, although FIG. 9C shows a comparatively smaller integrated handle 910 in the middle portion of filler panel 202, the present embodiment is more than capable of maintaining an integrated handle 910 at any location on filler panel 202. Therefore, although a multiplicity of integrated handles have been outlined in the above stated embodiments, for purposes of brevity and clarity each of the possible numerous possibilities of integrated handles are not shown in the present figures.

With reference now to integrated handles in general, and FIG. 9A in particular, in one embodiment handle element 902 is fixedly coupled with filler panel body 202 such that the base of handle element 902 is flush with the outer surface of filler panel body 202. Handle element 902 further comprises a head portion fixedly coupled with the base portion. Specifically, the head portion is disposed above the base portion in a manner which provides a grasping surface for removably coupling filler panel body 202 with respect to computer chassis 100. That is, the head portion of handle element 902 offers a gripping surface for a user thus simplifying the removal of keyed filler panel apparatus 900 from computer chassis 100. In addition, FIGS. 9B–D illustrate embodiments on which some of the bases of handle elements 904, 906, 908, and 910 are flush with filler panel body 202, and some are not. The present embodiment utilizes a base portion of handle element 902 which is flush with filler panel body 202 merely as one example.

Consequently, unlike prior art approaches which utilize a prying tool to remove and possibly damage a keyed filler panel assembly, the present embodiment allows a user to grasp integrated handle 902 in order to obtain a purchase on keyed filler panel assembly 900. In so doing, the extraction process of keyed filler panel assembly 900 with respect to computer chassis 100 is simplified. In a further embodiment, integrated handle 902 also allows a user to hold keyed filler panel assembly 900 in the proper position while coupling the filler panel with computer chassis 100.

With reference now to FIG. 9D, a recess portion 914 is illustrated within integrated handle 912. Specifically, recess portion 914 may be adapted to hold a label or other such item therein. It is appreciated that recess portion 914 may be utilized with any of the afore mentioned integrated handle types. Further, recess portion 914 may be used in more than one place on, or only on a portion of, any of the afore mentioned integrated handle types.

With reference now to FIG. 10, in one embodiment, locating element 208 is coupled to a filler panel body with integrated handle such as filler panel body 202. In one embodiment, locating element 208 is inserted through filler panel body 202 proximate to the location where attaching device 204 is or will be disposed. In the present embodiment, locating element 208 rigidly extends from filler panel body 202 and does not shift in position with respect to filler panel body 202.

In one embodiment, the locating element 208 is coupled to filler panel body 202 such that the top surface of locating element 208 is flush with the receiving surface of filler panel body 202. Specifically, FIG. 10 illustrates an embodiment in which the top surface of locating element 208 is flush with the receiving surface of filler panel body 202. In one embodiment, the shape of head portion 400, including recessed region 401, assists in the coupling of locating element 208 to a filler panel body. Also, as shown in FIG. 5, in one embodiment, retention portion 404 is comprised, for example, of ridges which assist in the rigid attachment of locating element 208 to filler panel body 202 by "gripping" the surrounding material comprising filler panel body 202.

Figure 11:
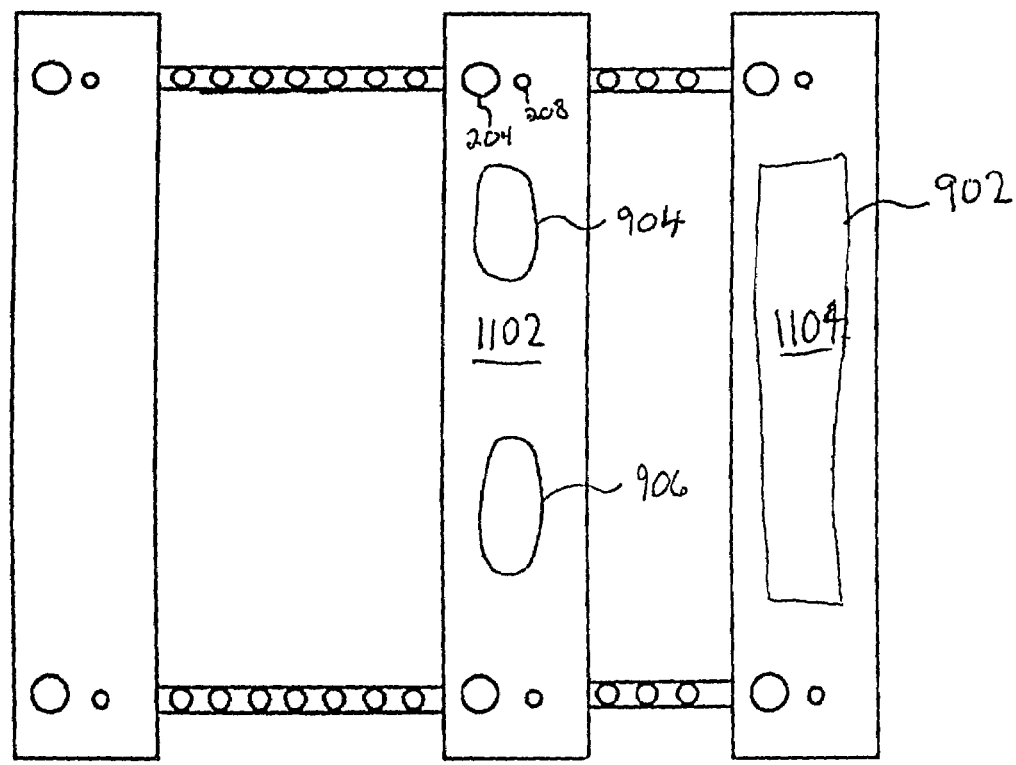
FIG. 11 is a front view of a plurality of keyed filler panel assemblies coupled to a computer chassis wherein removal coupling of a filler panel body with respect to a chassis is simplified in accordance with one embodiment of the present claimed invention.

With reference now to FIG. 11, an example of an embodiment in which a keyed filler panel assembly is removably coupled with a computer chassis 100 is illustrated. As shown in FIG. 11, a portion of a computer chassis 100 is depicted having mounting holes, typically shown as 102, therein. For purposes of the present example, the spacing between mounting holes 102 is defined by the CPCI standard. Keyed filler panel assembly 1102 is shown coupled to computer chassis 100 using locating element 206 and an attaching device 204. Keyed filler panel assembly 1102 further comprises, for example, integrated handles 904, and 906 in accordance with one embodiment. As a result, keyed filler panel assembly 1102 may be decoupled from computer chassis 100 without any prying and much less difficulty. Another keyed filler panel assembly 1104 is also shown coupled to computer chassis 100. In this example, keyed filler panel assembly 1104 comprises a single integrated handle 902. As a result, keyed filler panel assembly 1104 may also be decoupled from computer chassis 100 without any prying and much less difficulty. Because the present embodiment reduces the difficulty of decoupling the filler panel 202 from a computer chassis 100, no prying or additional parts are required. Hence, the present embodiment eliminates the unwanted costs and labor found in the prior art.

Figure 12:
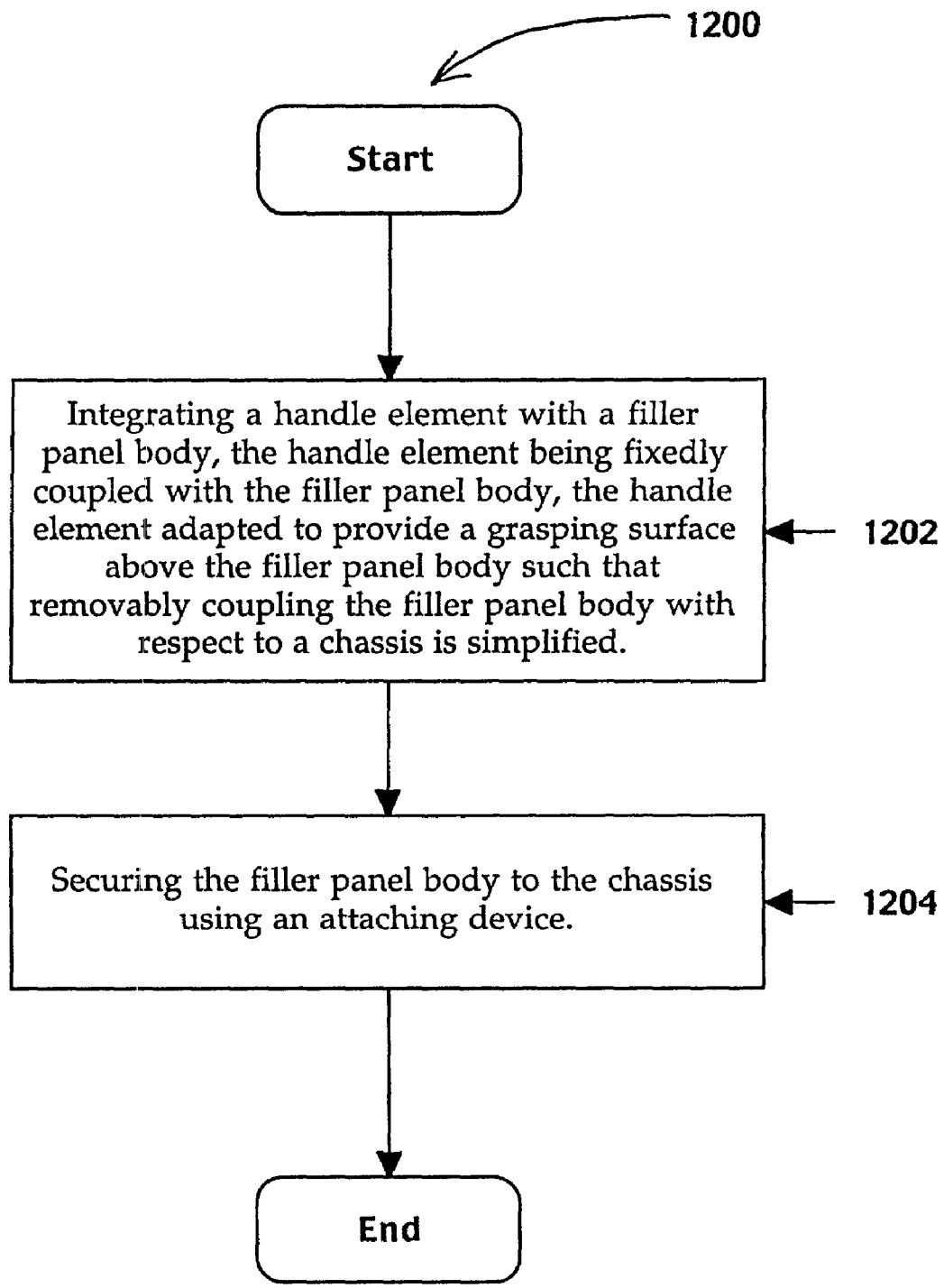
FIG. 12 is a flow chart of steps performed in accordance with one embodiment of the present claimed invention.
Figure 13A:
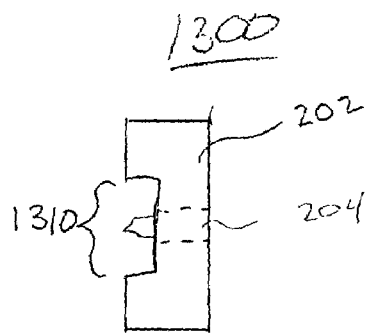
FIGS. 13A–D are views of embodiments of keyed filler panel assemblies with integrated recessed regions in accordance with embodiments of the present claimed invention.
Figure 13B:
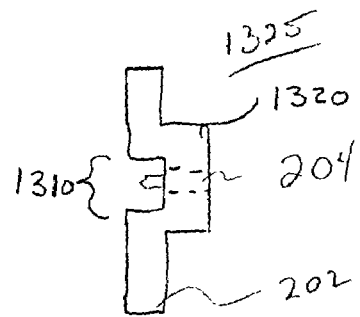
Figure 13C:
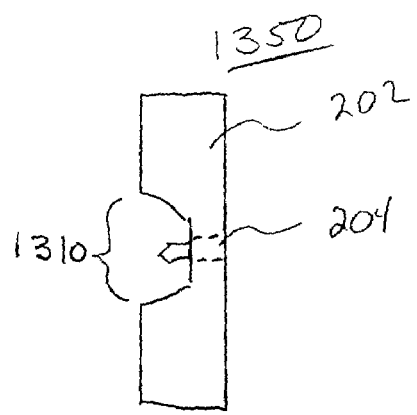
Figure 13D:
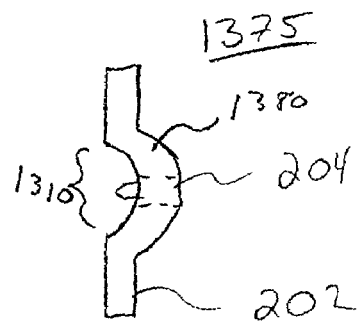
Figure 14A:
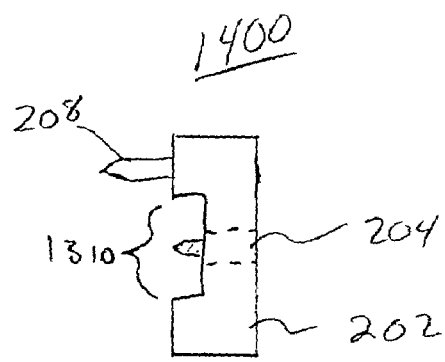
FIGS. 14A–D are views of embodiments of keyed filler panel assemblies with integrated recessed regions and locating elements in accordance with embodiments of the present claimed invention.
Figure 14B:
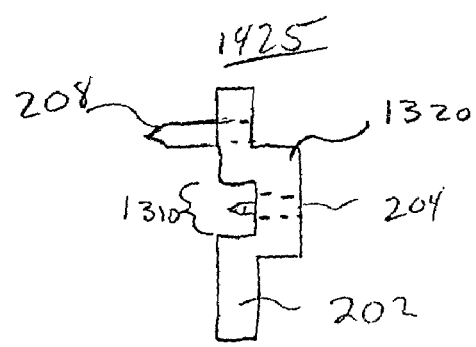
Figure 14C:
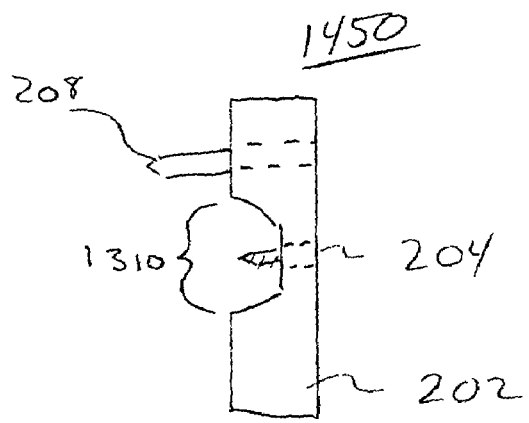
Figure 14D:
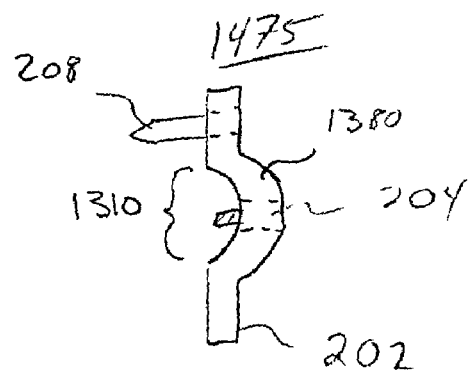

With reference now to FIG. 12, a flow chart 1200 summarizing the steps performed in accordance with one embodiment of the present invention is shown. At step 1202, the present embodiment integrates a handle element with a filler panel body 202. As described in detail above, the handle element (e.g. handle element 902, 904, 906, 908, 910, and 912 of FIGS. 9A–D) is fixedly coupled with filler panel body 202, and is adapted to provide a grasping surface above filler panel body 202 such that removably coupling filler panel body 202 from computer chassis 100 is simplified.

Next, at step 1204, the present embodiment secures the filler panel body of the keyed filler panel assembly to the chassis using an attaching device (e.g. captive screw 204 of FIGS. 2 and 3). Beneficially, the present embodiment eliminates the need to pry off the filler panels removably coupled to the computer chassis. Instead, the present embodiment allows keyed filler panel assemblies to be independently decoupled from a computer chassis at any time without concern for the subsequent damage of either filler panels or chassis. Additionally, by reducing aftermarket parts and enabling simplified removal of keyed filler panel assemblies with respect to a computer chassis, the present embodiment is extremely well suited to use in hot swapping environments.

Integrated Recessed Region Physical Characteristics

With reference now to FIGS. 13A–13D, perspective views of keyed filler panels with integrated recessed regions 1310 for attaching device 204 in accordance with embodiments of the present claimed invention are shown. The following discussion will begin with a detailed description of the physical characteristics of the present keyed filler panel with integrated recessed region 1310 for attaching device 204. The discussion will then contain a detailed description of the use and operation of the present keyed filler panel with integrated recessed region 1310 for attaching device 204. In the present embodiments, keyed filler panel assemblies 1300, 1325, 1350, and 1375 include integrated recessed regions (e.g., 1310) for attaching devices (e.g., 204). Furthermore, FIGS. 13B and 13D include embodiments wherein filler panel 202 may have raised captive screw elements (e.g., 1320 and 1380). Specifically, raised captive screw elements (e.g., 1320 and 1380) are utilized in the present embodiments to reduce the amount of material required per filler panel body 202. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIGS. 13A–D, keyed filler panel assemblies 1300, 1325, 1350, and 1375 also include and attaching device 204 which is adapted to be coupled to filler panel body 202. In one embodiment, attaching device 204 is comprised of a captive screw. Attaching device 204 is ultimately employed to removably couple filler panel body 202 to a computer chassis. Importantly, as will be discussed in detail below, in one embodiment, attaching device 204 is an attaching device 204 formed having dimensions and characteristics which are in compliance with an industry standard such as, for example, the CPCI standard, and the VME standard. Also, although a captive screw is specifically mentioned as the attaching device 204 in the present embodiment, the present invention is also well suited to use with various other types of attaching devices. However, for purposes of brevity and clarity each of the numerous possibilities of attaching devices are not shown in the present Figures.

With reference now to FIGS. 14A–14D, keyed filler panel assemblies 1400, 1425, 1450, and 1475 of the present embodiment also includes a locating element 208 which is coupled to filler panel body 202. FIG. 4 shows a side view of one embodiment of locating element 208. As shown in FIG. 4, in one embodiment, locating element 208 is comprised of a head portion 400, and an insertion portion 402. As discussed in detail above, in one embodiment, head portion 400 is adapted to be arranged flush with filler panel body 202 of FIGS. 14A–14D. Insertion portion 402 of locating element 208 is adapted to be inserted in an opening (e.g. a mounting hole) in a computer chassis to reduce interference generating movement of filler panel body 202 of FIGS. 14A–14D with respect to the computer chassis. FIG. 5 illustrates another embodiment in which locating element 208 also includes a retention portion 404 which is coupled to head portion 400. Retention portion 404 is adapted to enhance coupling of locating element 208 and filler panel body 202 of FIGS. 14A–14D. As described in detail above, locating element 208 is adapted to orient filler panel body 202 with respect to a computer chassis such that interference generating movement of filler panel body 202 is reduced.

With reference now to FIGS. 15A–15B and 16A–16B, keyed filler panel assemblies 1500, 1530, 1600, and 1625 of the present embodiment also include an electromagnetic interference (EMI) shield portion 206 coupled to filler panel body 202. EMI shield portion 206 is employed to prevent EMI leakage from a chassis to which keyed filler panel assemblies 1500, 1530, 1600, and 1625 are ultimately coupled. In one embodiment, EMI shield portion 206 is removably coupleable with filler panel body 202. The present embodiment is also well suited to an embodiment in which EMI shield portion 206 is integral with filler panel body 202.

Integrated Recessed Region Use and Operation

The following is a detailed description of the use and operation of the present keyed filler panel with integrated recessed region 1310 for attaching device 204. With reference to FIGS. 13–16, a recessed region 1310 is integral with filler panel body 202. In general, the filler panel body with integrated recessed region 1310 for attaching device 204 is formed utilizing processes such as "extruding", "shaping", "casting", "molding", "machining", "milling", "welding", "sculpting", "compressing" or the like. Thus, in one embodiment, recessed region 1310 is fixedly coupled with filler panel body 202. Moreover, recessed region 1310 is adapted to receive an attaching device 204 for removably coupling filler panel body 202 with respect to a chassis. Generally speaking, recessed region 1310 is adapted to provide a recessed surface below filler panel body 202 such that coupling filler panel body 202 with respect to computer chassis 100 is simplified. Specifically, recessed region 1310 offers a recessed area for attaching device 204 which allows a user to ensure the face of filler panel assembly 1310 completely seats (e.g., "bottoms out") with respect to a computer chassis 100 before attaching device 204 is fastened. That is, by utilizing recessed region 1310, a user may ensure keyed filler panel with integrated recessed region for attaching device 1300 is received correctly with respect to a computer chassis 100. Additionally, FIGS. 13A–13D illustrate a multitude of possible integrated recessed regions, 1310 which may be utilized with keyed filler panel 202. Although, a specific variety of possible integrated recessed region 1310 are shown, the illustrations are meant to be instructive not inclusive. Thus, it is appreciated that the present embodiment may incorporate multiple variations of integrated recessed region 1310 shapes within the scope of the present invention.

With reference now to FIGS. 14A–14D, each of the keyed filler panel assemblies (e.g., 1400, 1425, 1450, and 1475) of the present embodiment further include a locating element 208 coupled to filler panel body 202. FIGS. 14A–14D show side views of embodiments of locating element 208. With reference now to FIG. 4, in one embodiment, locating element 208 is comprised of a head portion 400, and an insertion portion 402. As discussed in detail herein, in one embodiment, head portion 400 is adapted to be arranged flush with filler panel body 202 of FIGS. 14A–14D. In addition, insertion portion 402 of locating element 208 is adapted to be inserted in an opening (e.g. a mounting hole) in a computer chassis to reduce interference generating movement of filler panel body 202 of FIGS. 14A–14D with respect to the computer chassis 100. FIG. 5 illustrates another embodiment of the present invention in which locating element 208 also includes a retention portion 404 which is coupled to head portion 400. Retention portion 404 is adapted to enhance coupling of locating element 208 and filler panel body 202 of FIGS. 14A–14D. As described in detail herein, locating element 208 is adapted to orient filler panel body 202 with respect to a computer chassis 100 such that interference generating movement of filler panel body 202 is reduced.

Figure 15A:
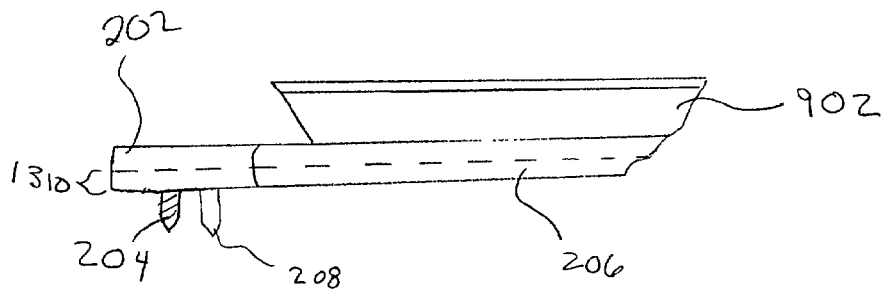
FIGS. 15A–B are views of embodiments of keyed filler panel assemblies with integrated recessed regions, locating elements, and integrated handle elements in accordance with embodiments of the present claimed invention.

With reference now to FIG. 15A, a side view 1500 of a keyed filler panel with integrated recessed region is shown. Specifically, FIG. 15A is a side view 1500 of one embodiment of a keyed filler panel with integrated recessed region 1310 for attaching device 204 which further comprises an integrated handle 902 and EMI shield portion 206. That is, in addition to the previous mentioned elements (e.g., recess portion 1310, attaching device 204, and locating element 208), side view 1500 includes a handle element 902 and EMI shield portion 206.

In general, handle element 902 is fixedly coupled with filler panel body 202 in a manner which provides a grasping surface for coupling and removably coupling filler panel body 202 with respect to a computer chassis 100. It is appreciated that handle element 902 may be any type of handle element described herein. A specific handle element 902 is described in the present embodiment merely for purposes of brevity and clarity.

In addition, EMI shield portion 206 is employed to prevent EMI leakage from a chassis to which keyed filler panel with integrated recessed region for attaching device 1500 is ultimately coupled. In one embodiment, EMI shield portion 206 is removably coupleable with filler panel body 202. The present embodiment is also well suited to an embodiment in which EMI shield portion 206 is integral with filler panel body 202.

Figure 15B:
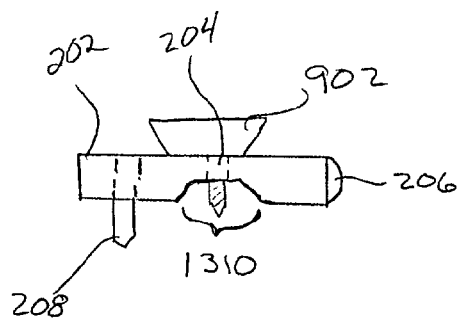

With reference now to FIG. 15B, a front view 1530 of a keyed filler panel with integrated recessed portion 1310 is shown. Specifically, FIG. 15B is an embodiment of front view 1530 showing the integration of recessed portion 1310, attaching device 204, locating element 208, handle element 902, and EMI shield portion 206. Although a specific shape of recessed portion 1310 is shown in the present embodiment, recessed portion 1310 may be of any of the previously illustrated shapes described herein. Further, recessed portion 1310 may run the entire length of filler panel body 202, or it may be found in only a portion of filler panel body 202.

Figure 16A:
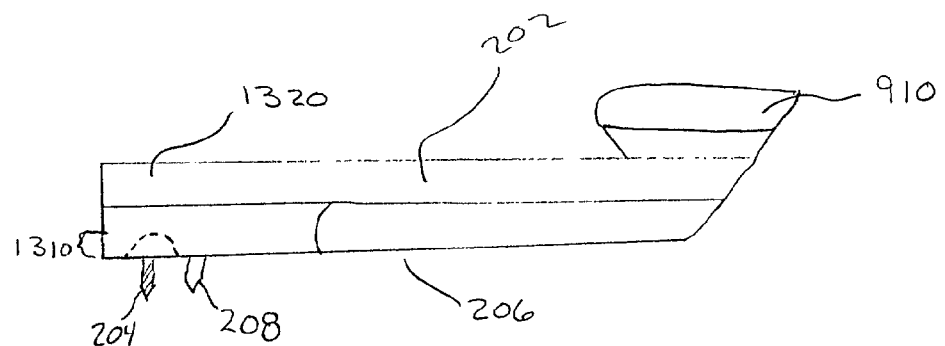
FIGS. 16A–B are views of embodiments of keyed filler panel assemblies with integrated recessed regions, locating elements, and integrated handle elements in accordance with embodiments of the present claimed invention.

With reference now to FIG. 16A, another side view 1600 of a keyed filler panel with integrated recessed portion 1310 is shown. Specifically, FIG. 16A is a side view 1600 of another embodiment of a keyed filler panel with integrated recessed portion 1310 for attaching device 204 which also comprises an integrated handle 910. That is, as stated above, side view 1600 includes recess portion 1310, attaching device 204, locating element 208, handle element 910 and EMI shield portion 206. Side view 1600 further includes raised captive screw element 1320. In general, raised captive screw element 1320 utilizes less material in conjunction with the manufacture of filler panel body 202. That is, since filler panel body 202 includes raised captive screw element 1320, a recessed portion 1310 can be formed without a need to thicken the entire wall of filler panel body 202.

In general, handle element 910 is fixedly coupled with filler panel body 202 in a manner which provides a grasping surface for coupling and removably coupling filler panel body 202 with respect to a computer chassis 100. It is appreciated that handle element 910 may be any type of handle element or a plurality of handle elements described herein. A short handle element 910 is shown merely for purposes of brevity and clarity.

In addition, EMI shield portion 206 is employed to prevent EMI leakage from a chassis to which keyed filler panel assemblies 1500 is ultimately coupled. In one embodiment, EMI shield portion 206 is removably coupleable with filler panel body 202. The present embodiment is also well suited to an embodiment in which EMI shield portion 206 is integral with filler panel body 202.

Figure 16B:
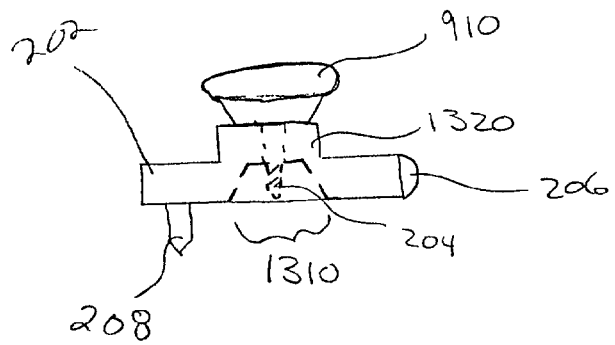

With reference now to FIG. 16B, a front view 1625 of a keyed filler panel with integrated recessed portion 1310 is shown. Specifically, FIG. 16B is an embodiment of front view 1625 showing the integration of recessed portion 1310, attaching device 204, locating element 208, handle element 902, and EMI shield portion 206. Although a specific shape of recessed portion 1310 is shown in the present embodiment, recessed portion 1310 may be of any of the previously illustrated shapes described herein. Further, recessed portion 1310 may run the entire length of filler panel body 202, or it may be found in only a portion of filler panel body 202.

Figure 17:
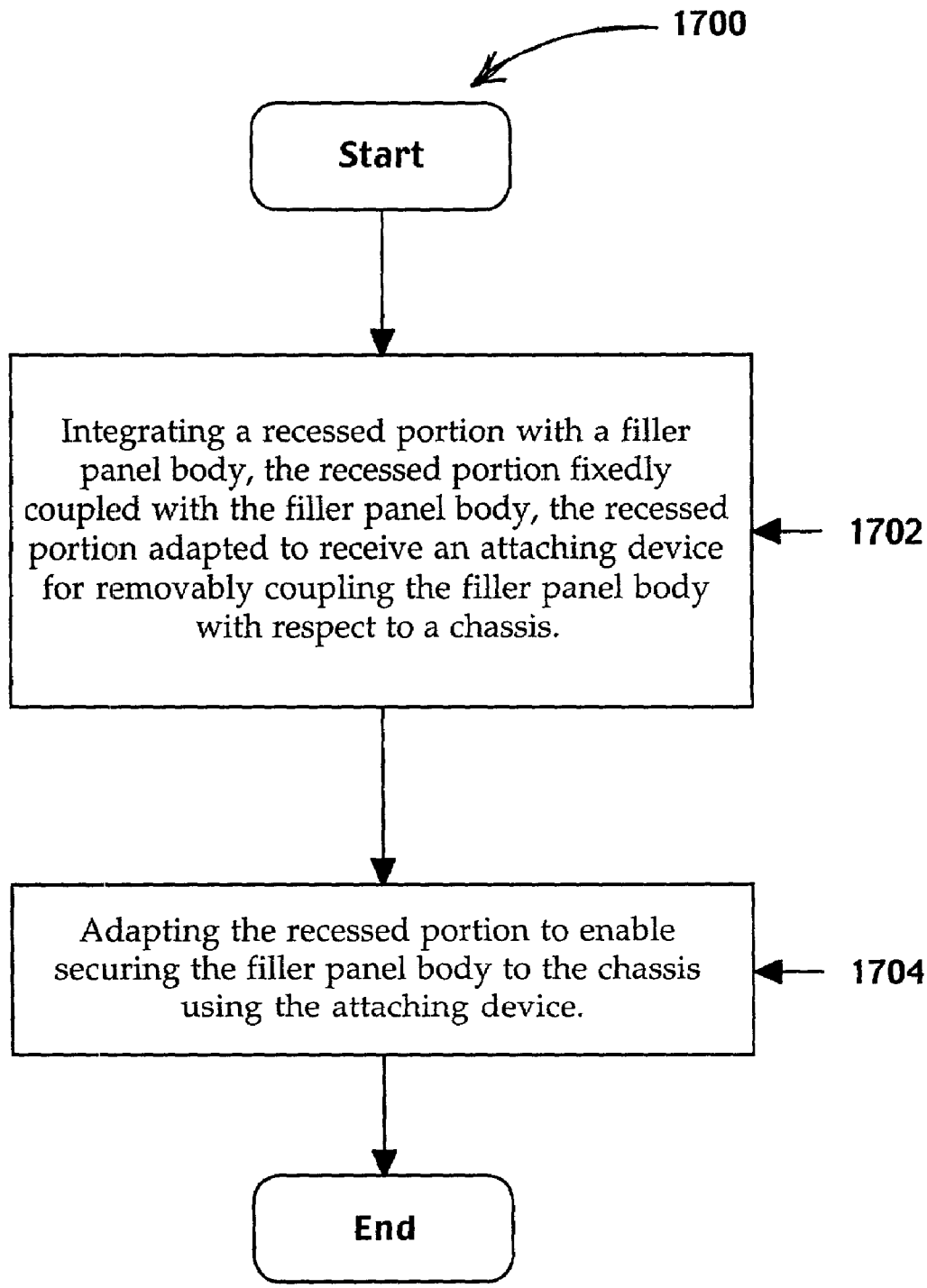
FIG. 17 is a flow chart of steps performed in accordance with one embodiment of the present claimed invention.

With reference now to FIG. 17, a flow chart 1700 summarizing the steps performed in accordance with one embodiment of the present invention is shown. At step 1702, the present embodiment integrates a recessed portion 1310 with a filler panel body 202. As described in detail above, the recessed portion 1310 is fixedly coupled with said filler panel body 202, and is adapted to receive an attaching device (e.g., 204) for removably coupling the filler panel body 202 with respect to a chassis (e.g., computer chassis 100).

Next, at step 1704, the present embodiment secures the filler panel body 202 to the chassis (e.g., computer chassis 100) using an attaching device (e.g. captive screw 204) adapted for use with recessed portion 1310. Beneficially, the present embodiment eliminates the need for multiple parts for mounting attaching device (e.g., captive screw 204) to filler panel body 202. Additionally, by reducing the amount of parts required for a filler panel body 202, or the thickness thereof, the present embodiment reduces associated manufacturing and assembly costs as well as post machining requirements.

Thus, the present invention provides a method and apparatus for a filler panel with integrated recessed region for attaching device which decreases alignment issues of a filler panel with respect to the chassis. The present invention also provides a method and apparatus for a filler panel with integrated recessed region for attaching device which reduces manufacturing and assembly costs. The present invention also provides a method and apparatus for a filler panel with integrated recessed region for attaching device which achieves the above accomplishment and which facilitates hot swapping of PCA cards. The present invention also provides a method and apparatus for a filler panel with integrated recessed region for attaching device which achieves the above accomplishments and which can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A keyed filler panel with integrated recessed region for a captive screw comprising:
   a filler panel body having a first end, a second end and a middle portion;
   a handle element formed as a layer on said filler panel body, said handle element protruding outwardly from the middle portion of a top of said filler panel body to provide a grasping surface for removably coupling said filler panel body with respect to a chassis of a computer system; and
   a recessed portion integral with said filler panel body, said recessed portion fixedly coupled with said filler panel body, said recessed portion having said captive screw therein for removably coupling said filler panel body with respect to said chassis.

2. The keyed filler panel with integrated recessed region for said captive screw of claim 1, wherein said recessed portion is extruded from said filler panel body.

3. The keyed filler panel with integrated recessed region for said captive screw of claim 1 further comprising:
   an electromagnetic interference (EMI) shield portion coupled with said filler panel body, said EMI shield portion configured to prevent EMI leakage from said chassis.

4. The keyed filler panel with integrated recessed region for said captive screw of claim 1 wherein said captive screw is for removably coupling said filler panel body with said chassis in accordance with a compact peripheral component interconnect (CPCI) standard.

5. The keyed filler panel with integrated recessed region for said captive screw of claim 1 wherein said captive screw is for removably coupling said filler panel body with said chassis in accordance with a VersaModular Eurocard (VME) standard.

6. The keyed filler panel wit with integrated recessed region for said captive screw of claim 1, wherein said handle element does not destructively interfere with said captive screw.

7. The keyed filler panel with integrated recessed region for said captive screw of claim 1 wherein said filler panel body further comprises a locating element coupled with said filler panel body, said locating element configured to orient said filler panel body with respect to said chassis such that interference generating movement of said filler panel body is reduced.

8. A keyed filler panel with integrated recessed region for a captive screw comprising:
   a filler panel body having a first end, a second end and a middle portion;
   a recessed portion integral with said filler panel body, said recessed portion fixedly coupled with said filler panel body, said recessed portion having said captive screw therein for removably coupling said filler panel body with respect to a chassis of a computer system;
   a handle element formed as a layer on said filler panel body, said handle element protruding outwardly from the middle portion of a top of said filler panel body to provide a grasping surface for removably coupling said filler panel body with respect to said chassis; and
   a locating element coupled with said filler panel body, said locating element configured to orient said filler panel body with respect to said chassis such that interference generating movement of said filler panel body is reduced.

9. The keyed filler panel with integrated recessed region for said captive screw of claim 8, wherein said recessed portion is extruded from said filler panel body.

10. The keyed filler panel with integrated recessed region for said captive screw of claim 8 further comprising:
    an electromagnetic interference (EMI) shield portion coupled with said filler panel body, said EMI shield portion configured to prevent EMI leakage from said chassis.

11. The keyed filler panel with integrated recessed region for said captive screw of claim 8 wherein said captive screw is for removably coupling said filler panel body with said chassis in accordance with a compact peripheral component interconnect (CPCI) standard.

12. The keyed filler panel with integrated recessed region for said captive screw of claim 8 wherein said captive screw is for removably coupling said filler panel body with said chassis in accordance with a VersaModular Eurocard (VME) standard.

13. The keyed filler panel with integrated recessed region for said captive screw of claim 8, wherein said handle element does not destructively interfere with said captive screw.

* * * * *